US008674311B1

(12) United States Patent
Nagarkar et al.

(10) Patent No.: US 8,674,311 B1
(45) Date of Patent: Mar. 18, 2014

(54) POLYCRYSTALLINE LANTHANUM HALIDE SCINTILLATOR, DEVICES AND METHODS

(75) Inventors: Vivek Nagarkar, Weston, MA (US); Valeriy Gaysinskiy, Allston, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 12/721,505

(22) Filed: Mar. 10, 2010

(51) Int. Cl.
*G01T 1/20* (2006.01)
(52) U.S. Cl.
USPC .... 250/366; 250/361 R; 250/367; 250/370.11
(58) Field of Classification Search
USPC ............ 250/361 R, 366, 367, 370.11
See application file for complete search history.

(56) References Cited

U.S. PATENT DOCUMENTS

| | | | | |
|---|---|---|---|---|
| 4,668,480 | A * | 5/1987 | Fujiyashu et al. | 118/719 |
| 7,504,634 | B2 | 3/2009 | Shah | |
| 7,612,342 | B1 * | 11/2009 | Nagarkar | 250/362 |
| 2007/0051896 | A1 * | 3/2007 | Okada et al. | 250/370.11 |
| 2007/0205371 | A1 * | 9/2007 | Inoue | 250/370.11 |
| 2008/0083877 | A1 * | 4/2008 | Nomura et al. | 250/370.11 |
| 2008/0286461 | A1 * | 11/2008 | Noguchi et al. | 427/248.1 |
| 2009/0008561 | A1 * | 1/2009 | Nagarkar et al. | 250/361 R |
| 2009/0050811 | A1 * | 2/2009 | Barrett et al. | 250/363.04 |

OTHER PUBLICATIONS

Babla et al., "A triple-head solid state camera for cardiac single photon emission tomography," *Proc. of SPIE* 6319:63190M 1-5 (2006).

Bartzakos & Thompson, "A PET detector with depth-of-interaction determination," *Phys. Med. Biol.* 36(6): 735-748 (1991).
Burr et al., "Evaluation of a prototype small-animal PET detector with depth-of-interaction encoding," *IEEE Trans. Nucl. Sci.* 51(4):1791-1798 (2004).
Derenzo et al., "Initial characterization of a position-sensitive photodiode/BGO detector for PET," *IEEE Trans. Nucl. Sci.* 36(1):1-6 (1989).
Gramsch, "Measurement of the depth of interaction of an LSO scintillator using a planar process ADP," *IEEE Trans. on Nucl. Sci.* 50 (3):307-312 (2003).
Huber et al., "An LSO scintillator array for a PET detector module with depth of interaction measurement," *IEEE Trans. Nucl. Sci.* 48:684-688 (2001).
Inadama et al., "A Depth of Interaction Detector for PET with GSO Crystals doped with Different amount of Ce," IEEE, 1099-1103 (2002).
Karp & Daube-Witherspoon, "Depth-of-interaction determination in NaI(T1) and BGO scintillation crystals using a temperature gradient," *Nucl. Instr. Methods Phys. Res.* A260:509-517 (1987).
Knoll, "Specialized Detector Configurations Based on Scintillation," in: *Radiation Detection and Measurement*, Second Edition, John Wiley & Sons, NY, p. 344-345 (1989).
Knoll, "Pulse Shape Discrimination," in: *Radiation Detection and Measurement*, Third Edition, Glenn F. Knoll, John Wiley & Sons, NY, p. 646 (2000).
Kupinski and Barrett, *Small-Animal SPECT Imaging*, Springer Science+Business Media Inc. (2005).
Ling et al., "Depth of interaction decoding of a continuous crystal detector module," *Phys. Med. Biol.* 52:2213-2228 (2007).

(Continued)

*Primary Examiner* — Marcus Taningco
(74) *Attorney, Agent, or Firm* — Wilson Sonsini Goodrich & Rosati

(57) ABSTRACT

Evaporation methods and structures for depositing a scintillator film on a surface of a substrate. A radiation detection device including a doped lanthanum halide polycrystalline scintillator formed on a substrate.

25 Claims, 9 Drawing Sheets

(56) References Cited

OTHER PUBLICATIONS

MacDonald & Dahlbom, "Depth of interaction for PET using segmented crystals," *IEEE Trans. Nucl. Sci.* 45(4):2144-2148 (1998).
Miyaoka et al., "Design of a depth of interaction (DOI) PET Detector Module," *IEEE Trans. on Nucl. Sci.* 45(3):1069-1073 (1998).
Moisan et al., "Segmented LSO crystals for depth-of-interaction encoding in PET," *IEEE Trans. Nucl. Sci.* 45(6):3030-3035 (1998).
Murayama et al., "Design of a depth of interaction detector with a PS-PMT for PET," *IEEE Trans. Nucl. Sci.* 47(3):1045-1050 (2000).
Nagarakar et al., "Microcolumnar and polycrystalline growth of $LaBr_3$:Ce scintillator," *Nucl. Instr. and Meth.* A (2010), doi:10.1016/j.nima.2010.06.190.
Nagarakar et al., "Development of microcolumnar $Labr_3$:Ce scintillator," *Proc. of SPIE* 7450:745006-1-745006-10 (2009).
Saoudi et al., "Investigation of depth-of-interaction by pulse shape discrimination in multicrystal detectors read out by avalanche photodiodes," *IEEE Trans. Nucl. Sci.* 46(3):462-467 (1999).
Schramm et al., High-resolution SPECT using multi-pinhole collimation, *IEEE Trans. Nucl. Sci.* 50(3):774-777 (2003).
Seidel et al., "Depth identification accuracy of a three layer phoswich PET detector module," *IEEE Trans. Nucl. Sci.* 46(3):485-490 (1999).
Shah et al., "$LcCl_3$:Ce scintillator for γ-ray detection," *Nucl. Instr. and Meth. Phys. Res. A* 505: 76-81 (2003).
Shao et al., "Dual APD array readout of LSO crystals: optimization of crystal surface treatment," *IEEE Trans. Nucl. Sci.* 49(3):649-654 (2002).
Smith et al., "Design of multipinhole collimators for small animal SPECT," *IEEE NSS/MIC Conference Records* (2004).
Stahle et al., "Fabrication of CdZnTe strip detectors for large area arrays," *SPIE* 3115:90-97 (1997).
Streun et al., "Pulse shape discrimination of LSP and LuYAP scintillators for depth of intereaction detection in PET," *IEEE Trans. Nucl. Sci.* 50(3):344-347 (2003).
Tornai et al., Comparison of compact gamma cameras with 1.3- and 2.0-mm quantized *IEEE Trans. Nucl. Sci.* 52(5):1251-1256 (2005).
Yamamoto & Ishibashi, "A GSO depth of interaction detector for PET," *IEEE Trans. Nucl. Sci.* 45(3): 1078-1082 (1998).
Yamashita et al., "High resolution block detectors for PET," *IEEE Trans. Nucl. Sci.* 37(2):589-593 (1990).

\* cited by examiner

POLYCRYSTALLINE LANTHANUM HALIDE SCINTILLATOR, DEVICES AND METHODS

CROSS-REFERENCES TO RELATED APPLICATIONS

The present application is related to U.S. application Ser. No. 12/721,489, filed on Mar. 10, 2010 and U.S. application Ser. No. 12/721,462, filed on Mar. 10, 2010, each of which is being filed concurrently herewith, the full disclosures of which are incorporated herein by reference.

BACKGROUND OF THE INVENTION

The present invention relates generally to scintillator compositions and related structures and methods. More specifically, the present invention relates to lanthanum halide scintillator compositions and methods of fabricating scintillator compositions using evaporation-based techniques.

Scintillation spectrometers are widely used in detection and spectroscopy of energetic photons (e.g., X-rays and γ-rays). Such detectors are commonly used, for example, in nuclear and particle physics research, medical imaging, diffraction, non destructive testing, nuclear treaty verification and safeguards, nuclear non-proliferation monitoring, and geological exploration.

Important requirements for the scintillation materials used in these applications include high light output, transparency to the light it produces, high stopping efficiency, fast response, good proportionality, low cost and availability in large volume. These requirements are often not met by many of the commercially available scintillators. While general classes of chemical compositions may be identified as potentially having some attractive scintillation characteristic(s), specific compositions/formulations and structures having both scintillation characteristics and physical properties necessary for actual use in scintillation spectrometers and various practical applications, as well as capability of imaging at a high resolution, have proven difficult to predict or produce. Specific scintillation properties are not necessarily predictable from chemical composition alone, and preparing effective scintillators from even candidate materials often proves difficult. For example, while the composition of sodium chloride had been known for many years, the invention by Hofstadter of a high light-yield and conversion efficiency scintillator from sodium iodide doped with thallium launched the era of modern radiation spectrometry. More than half a century later, thallium doped sodium iodide, in fact, still remains one of the most widely used scintillator materials. Since the invention of NaI(Tl) scintillators in the 1940's, for half a century radiation detection applications have depended to a significant extent on this material. As the methodology of scintillator development evolved, new materials have been added, and yet, specific applications, particularly those requiring high resolution imaging and large volumes, are still hampered by the lack of scintillators suitable for particular applications.

As a result, there is continued interest in the search for new scintillator formulations and physical structures with both the enhanced performance and the physical characteristics needed for use in various applications. Today, the development of new scintillators continues to be as much an art as a science, since the composition of a given material does not necessarily determine its performance and structural properties as a scintillator, which are strongly influenced by the history (e.g., fabrication process) of the material as it is formed. While it is may be possible to reject a potential scintillator for a specific application based solely on composition, it is not possible to predict whether a material with promising composition will produce a scintillator with the desired properties.

One promising group of scintillator compositions includes those made of lanthanum halides. Solid crystalline forms of cerium (Ce) doped LaBr have been produced and currently available from commercial sources. For example, bulk LaBr crystals have been synthesized by melt-based techniques and using crystal growth techniques such as though the high pressure Bridgman technique to successfully produce scintillation grade material. Crystal growth methods as above, however, are generally complex, require specialized equipment, and extreme care to obtain a defect-free crystal growth. The complexity of the current methods often results in yield problems and a high cost for the scintillator.

Crystalline $LaBr_3$ films have also been fabricated by epitaxial growth techniques. However, the process has generally been expensive and produced generally thin films. Given the promising scintillation characteristics of crystalline $LaBr_3$ materials, fabrication of larger scintillators is a cost-efficient manner would be tremendously beneficial.

Thus, a need exists for improved scintillator compositions and structures, including improved lanthanum halide scintillators, suitable for use in various radiation detection applications, as well as improved methods of fabricating larger scale scintillator films is a more cost-effective manner.

BRIEF SUMMARY OF THE INVENTION

The present invention provides lanthanum halide scintillators, related devices and methods, as well as unique evaporation-based methods and structures for fabricating scintillators. The scintillators of the invention are useful in a variety of applications, including, for example, spectroscopy detection of energetic photons (x-rays and gamma-rays) and imaging applications (e.g., x-ray imaging, PET, SPECT, etc.).

In one aspect, the present invention provides hot-wall evaporation based techniques and related structures for fabrication of scintillator compositions. A method of forming scintillator on a surface of a substrate can include providing a hot wall evaporation apparatus, which may include an evaporation chamber having one or more chamber walls disposed between a first chamber end/portion with a positioned substrate and a second chamber end/portion with positioned one or more scintillator source materials. The method further includes depositing a scintillator film on a surface of the positioned substrate by a process including applying heat to the evaporation chamber so as to vaporize scintillator source material for film deposition, wherein applying heat comprises maintaining a temperature relationship of $T_{wall} > T_{source} > T_{substrate}$ for at least a portion of the deposition process.

As indicated, a portion of the chamber can include one or more source boats or reservoirs or boats for corresponding one or more source materials. A single source may be utilized, such as a crystalline composition, for evaporation and deposition on a substrate surface, or two or more source boats may be utilized. In one embodiment, the source material comprises a main component charge in a first boat and dopant charge in a second boat. Embodiments with more than one source boat may be utilized, for example, where two or more source materials are utilized (for example, $LaBr_3$ and $LaCl_3$) and/or where such source materials include different melting properties (e.g., melting temperatures), or where attention is paid to different partial pressures of source vapor during the deposition process. Different source boats/materials may be under heating control of a single heating element, a plurality of heating elements, with independent heating or control optionally being selected for different sources.

Fabrication techniques and structures or apparatus may be utilized for fabrication of a variety of different scintillator compositions. In one exemplary embodiment, fabrication methods include forming a doped lanthanum halide scintillator (e.g., polycrystalline film) on substrate. Halides can include a single halide (e.g., Cl, Br, etc.) or a mixture of halides. Various dopants can be included in scintillators of the present invention, including cerium (Ce) and the like in one or separate boats. The fabrication techniques of the present invention allow preservation of the stoichiometry of the deposited films, even where source materials include compounds having relatively large differences in vapor pressures and/or sticking coefficients. The deposition techniques allow fabrication of generally thick scintillators (e.g., greater than 1 cm) and/or large area (e.g., 50×50 cm$^2$ or larger) screens in a cost effective manner. Films may be fabricated on a variety of substrates, including opaque or transparent substrates of any variety of shapes, sizes, and/or compositions, thereby making them adaptable for incorporation into a variety of detector configurations.

In another aspect, the present invention includes structures or apparatuses for depositing scintillator according to the techniques described herein. In one embodiment, a hot wall evaporation apparatus for depositing a scintillator film on a surface of a substrate is provided. The apparatus includes an evaporation chamber having a first end with a substrate holder, a second end with one or more scintillator source material boats, and one or more chamber walls. The apparatus includes a heating system configured to apply heating to the chamber so as to vaporize a scintillator source material positioned in the one or more boats for scintillator deposition on a surface of a substrate positioned in the holder, where heating establishes a temperature relationship of $T_{wall} > T_{source} > T_{substrate}$.

As indicated, fabrication techniques and structures herein may be utilized for fabrication of a variety of different scintillator compositions. Thus, in another aspect, the present invention includes scintillator compositions deposited according to the described methods. In one embodiment, a radiation detection device includes a doped lanthanum halide polycrystalline scintillator (e.g., LaBr$_3$:Ce, LaCl$_3$:Ce) formed on a substrate. The polycrystalline scintillator is formed on a substrate by a process including evaporating one or more source materials in an evaporation chamber having one or more heated walls during vapor deposition of the scintillator on the substrate. A temperature relationship of $T_{wall} > T_{source} > T_{substrate}$ is maintained for at least a portion of the deposition process.

For a fuller understanding of the nature and advantages of the present invention, reference should be had to the ensuing detailed description taken in conjunction with the accompanying drawings. The drawings represent embodiments of the present invention by way of illustration. The invention is capable of modification in various respects without departing from the invention. Accordingly, the drawings/figures and description of these embodiments are illustrative in nature, and not restrictive.

BRIEF DESCRIPTION OF THE DRAWINGS

FIG. 9A shows short, 20 ns X-ray excitation data showing the primary 1/e decay time of ~8 ns, which is faster than ~20 ns reported for this material from commercially available crystals. The secondary decay, however, is 21 ns which is within the 16 to 28 ns range reported for LaBr3:Ce crystals. FIG. 9B shows corresponding afterglow measurement obtained using 100 kVp X-rays for a duration of 100 ms. X-ray exposure was approximately 500 mR. Films demonstrate similar behavior compared to the crystals, indicating that the vapor deposition process does not introduce any significant undesirable traps to alter the films' decay characteristics.

DETAILED DESCRIPTION OF THE INVENTION

Figure 1:
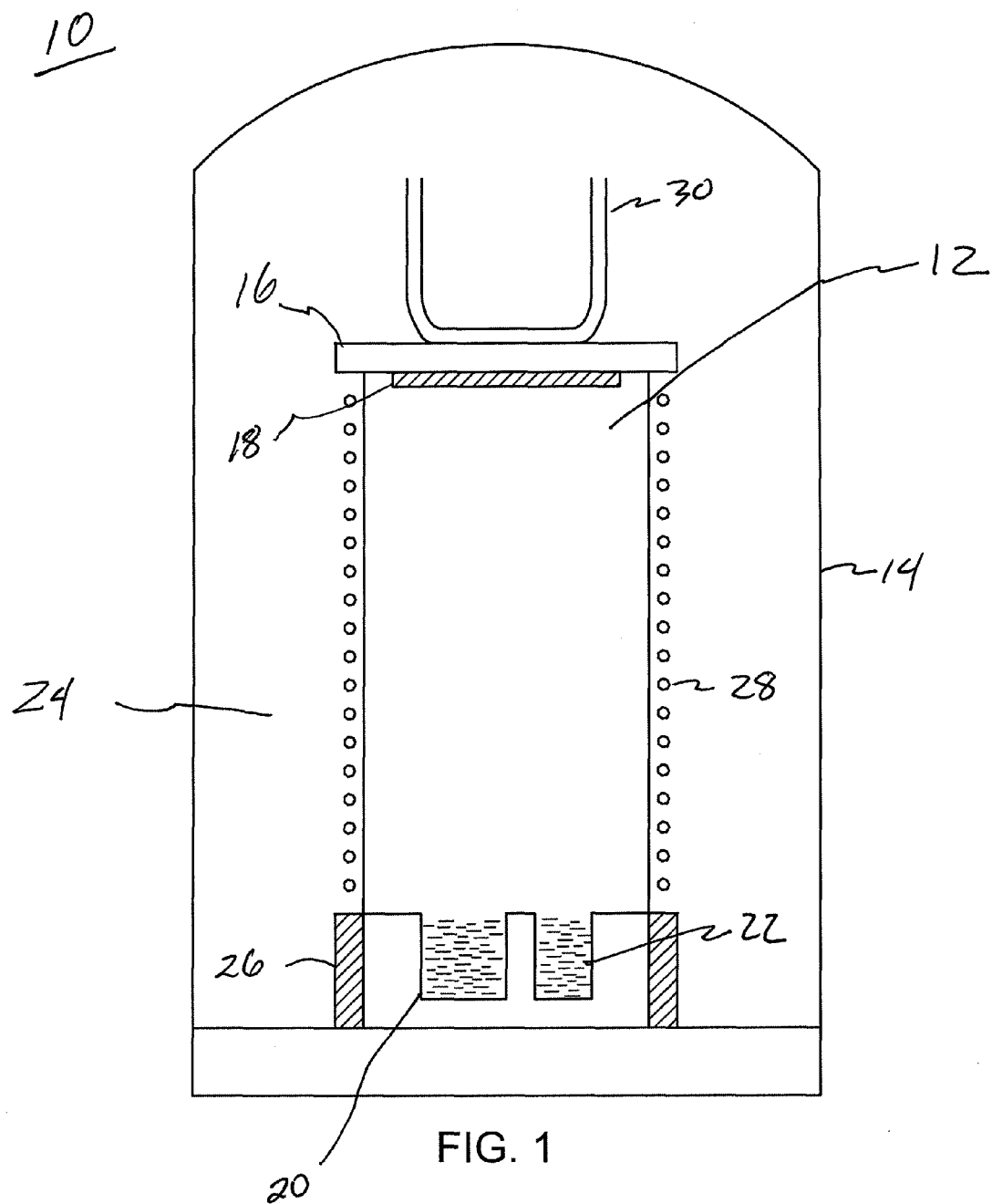
FIG. 1 illustrates an evaporation apparatus according to an embodiment of the present invention.

The present invention provides lanthanum halide scintillators, related devices, as well as unique evaporation-based methods and structures for fabricating scintillators.

Hot wall evaporation (HWE) techniques, as described herein, include a vacuum deposition technique where scintillator film is efficiently deposited on a surface of a substrate. In the simplest form the HWE apparatus includes of a chamber or cylinder positioned in a vacuum, heated, with an evaporation source "boat" or reservoir at one end (typically the bottom in an upright positioned chamber) and a temperature controlled substrate at the other (typically the top in an upright positioned chamber). In one embodiment, two source boats are used to accomplish co-evaporation of a main source charge and a dopant charge, e.g., lanthanum halide salt and a dopant salt, for deposition of a scintillator film on a substrate surface. The heated cylinder wall serves to enclose, deflect and effectively direct the vapor from the source to the substrate where molecules are deposited with a shallow impinging angle. With the substrate being the coolest part in the system (e.g., compared to the cylinder wall and source material), molecules adhere solely or primarily to the substrate and do not substantially accumulate on the hot walls, making efficient use of the source material. To ensure thermodynamic equilibrium the relationship between the substrate temperature and that of the source and the heated wall should be: $T_{wall} > T_{source} > T_{substrate}$.

The HWE techniques as described herein may provide several advantages, including suitability for large volume scintillator fabrication in a cost efficient manner as the described fabrication methods are highly efficient. Additionally, present techniques allow for production of generally thick, large area scintillators that could not be produced generally, and certainly not efficiently, with previously existing techniques.

As indicated, one advantage of present fabrication techniques is high efficiency material deposition, thereby minimizing source material loss during the fabrication process. Scintillator deposition is efficiently directed to the substrate, as the substrate is the coolest part of the evaporation environment. As a result, vapors that impinge on the system parts, including the hot walls, are deflected and mostly condense only on the relatively cool substrate. Consequently, material loss is minimum, enhancing the deposition efficiency. Deposition efficiency has been observed above 30% and well above 50%, in some cases remarkably high and in the order of above about 90% to 95% or more. For example, a 1 cm thick film on a 10×10 cm2 substrate could be deposited using as little as 650 grams of $LaCl_3$ source material. To achieve the same 1 cm thickness using conventional evaporation techniques would require over three kilograms of material, which would be expensive and impractical to handle, and would require significantly greater complexity in the mechanical components and temperature control electronics for the evaporation source in the HWE chamber.

The conventional vapor deposition technique, which is commonly used to produce films of such scintillators as CsI:Tl, is not suitable for growing lanthanide halides at least for several important reasons. Growth of alkali halides such as CsI:Tl require low substrate temperature, generally on the order of 50 C, compared to its source temperature of 700 C (melting point of CsI:Tl is 621 C) in order to foster the desired growth. This is possible to achieve by conventional techniques because the large distance separates the source and the substrate. This low substrate temperature is maintained at the cost of reduced deposition efficiency as the evaporated material is distributed inside the entire deposition apparatus exposing the vacuum equipment to CsI. Lanthanide halides are highly corrosive and must be contained to a localized region in the evaporator, such as a HWE chamber as described herein, to protect the vacuum equipment. This also helps in maintaining higher substrate temperatures needed to grow the material with desired scintillation properties. Specifically, the growth of lanthanide halides needs substrate temperatures in the rage of 400 C to 600 C, compared to its source temperature of 900 C (melting point of $LaBr_3$ is 783 C) in order to foster the desired growth. The HWE methods described herein permit this due in part to the proximity of the substrate to hot walls of the chamber and the heated source boats. Thus, while the HWE methods described herein may be used to deposit other scintillators, conventional methods used to grow common scintillators such as CsI:Tl may not be applicable to lanthanide halides.

The HWE techniques described herein further advantageously allow preservation of stoichiometry during the deposition process, even where the source material(s) include compounds having relatively large differences in vapor pressures and sticking coefficients. This may be due to the fact that the HWE takes place under conditions of thermodynamic equilibrium, which allows the high vapor pressures of various compounds to be maintained. As a result, the dissociation of various constituents does not present a problem for scintillator deposition as described herein. As a matter of fact, the interaction of components with each other on the substrate surface can lead, under favorable growth conditions, to the formation and growth of the compound. Thus, HWE is particularly advantageous for applications including depositing thick films using two sources—a main component charge and a dopant charge, where the two source materials differ by orders of magnitude in their vapor pressure. For deposition of doped lanthanum halides, for example, HWE will preserve the stoichiometry in the deposited material, such as $LaCl_3$:Ce or $LaBr_3$:Ce.

A valuable aspect of HWE described herein, particularly in thick film deposition, is that the growth rate is an order of magnitude higher than that of conventional systems. For a one-component system the deposition rate is proportional to the impingement rate (Ø) of atoms on the substrate at constant temperature, and is governed by the equation:

$$\emptyset = n(kT/2\pi m)^{1/2}$$

where n is the number of evaporant molecules per unit volume, m is the mass of the molecule, k is the Boltzmann constant, and T is the source temperature. For hot wall epitaxy of $LaCl_3$:Ce this equation still holds, since the vapor phases of constituent compounds are in equilibrium with the source material. Therefore, the deposition process is basically very similar to that for a single element. As the source temperature T is very high and the substrate is the coldest part in the evaporator, the impingement rate of molecules and hence the film growth rate can be an order of magnitude higher than the conventional systems. The growth rate is related to the impingement rate by the following equation:

Growth rate={Ø*Avg thickness of the $LaCl_3$:Ce monolayer}/The surface density of $LaCl_3$:Ce.

The process of material growth consists of a series of events that begin with the physical adsorption of a fraction of the incident molecules on the substrate or by forming a stable nucleus by interaction with the other adsorbed molecules. This process of nucleation and growth is typical for the formation of a film of one material on a substrate of a different material. In HWE no nucleation takes place, but growth occurs by direct adsorption of the molecules on low energy sites, such as kinks on an atomic ledge. Under these conditions, even when the growth rate is very high, a mono-layer by mono-layer deposition (epitaxial) growth is obtained resulting in excellent crystallinity of films with superior optical transmission properties.

As noted, the relationship $T_{wall} > T_{source} > T_{substrate}$ in the evaporation apparatus is maintained for at least a portion of the deposition process. The heating/temperature applied to the chamber wall(s), source, and substrate during the deposition process may be selected or defined relative to the melting temperature of a source material. For example, $T_{source}$ may be selected from a range of about 105-125% of a source material melting temperature. $T_{wall}$ may be selected from a range of about 110% to about 150% of a source material melting temperature; and $T_{substrate}$ selected from a range of about 50% to about 80% of a source material melting temperature. For example, the $LaBr_3$ melting point is 783 C. Therefore, the source temperature should be in the range of 820 C to 980 C, the wall temperature should be in range of 860 C to 1175 C, and the substrate temperature should be 390 C to 625 C.

In the doped lanthanum halide scintillator example, deposition occurs under vacuum conditions, typically in a pressure range of about $10^{-5}$ to $10^{-6}$ Torr. Source materials can include doped lanthanum halide crystals (e.g., LaBr$_3$:Ce), or multiple source materials such as a lanthanum halide salt and a dopant salt (e.g., Ce salt). Source temperature will generally be in the range of about 820 C to about 980 C; wall temperature from about 860 C to about 1175 C; and substrate temperature from about 390 C to about 625 C, while maintaining the relationship $T_{wall} > T_{source} > T_{substrate}$. In some embodiments, deposition occurs on a high-temperature substrate about 300-400 degrees C., or above 400-800 degrees C. (and any integral number therebetween).

A HWE apparatus, according to one embodiment of the present invention is described with reference to FIG. 1. The apparatus 10 includes a hot wall deposition chamber 12 illustrated positioned in a vacuum chamber 14 in an upright positioning, having a top portion and a bottom portion. The top portion includes a substrate holder 16, with a deposition substrate 18 illustrated coupled with the holder 16. The bottom portion includes source material areas or source boats, with a main component (e.g., LaBr$_3$) charge in a first boat 20 and a dopant charge (e.g., CeBr$_3$) in a second boat 22. The apparatus 10 further includes a heating system 24 configured to achieve the $T_{wall} > T_{source} > T_{substrate}$ relationship during the deposition process. The heating system 24 in the illustrated embodiment includes heating elements 20 (e.g., heater electrodes) coupled with the source boats 20, 22, chamber wall heating elements 28 (e.g., resistive heating elements), and a substrate heating/cooling system 30.

Component temperature ranges for use of the apparatus of FIG. 1 in fabrication of polycrystalline LaBr3:Ce, as an illustrative example, are described. The melting point of LaBr3 is about 783 C. Therefore, the LaBr3 source temperature should be in the range of about 820 C to 980 C. The CeBr3 melting point is 720 C, therefore, the CeBr3 source temperature should be in the range of 750 C to 870 C. The wall temperature should be in range of 860 C to 1175 C, and the substrate temperature should be 390 C to 625 C. The temperature relationship of apparatus components will be maintained as described above.

To a high-vacuum vapor deposition system with, for example, a 24 inch diameter stainless steel bell jar, roughing pumps and a high vacuum cryo pump, vacuum gauges, two evaporation boats, the necessary power supplies, feedthroughs, and crystal monitors are added a HWE column with appropriate heaters and a water-cooled substrate holder. The walls of the column can be heated using a conformal resistive heater.

The films can be grown on a variety of substrate surfaces, including, for example, a transparent glass plate, which can be borosilicate glass or fused silica, but not soda-lime glass, which has a UV cutoff at 300-350 nm. Scintillator material may be grown directly on a para-xylylene polymer coating or layer, which may be disposed on another substrate surface. In depositing the material, the process can advantageously allow for controlling the dopant (Ce) concentration within deposited films; controlling thickness uniformity (e.g., above 99.5%) over the entire area for uniform detection efficiency and scintillation response; maximizing the optical transmission of the resultant material for improved light collection efficiency; maintaining excellent film adhesion to the substrate; optionally achieving a gradient of dopant in the resulting scintillator In one embodiment of a high-vacuum-based HWE system, as shown in FIG. 1, source materials are co-evaporated using two boats. This approach minimizes difficulties in achieving the proper chemical composition of the deposited material arising from large differences in the vapor pressures of a main component charge and the dopant charge. In the embodiment illustrated in FIG. 1, the source boats and the chamber walls are coupled to heating elements that may provide heating to the substrate. In some instances, the substrate may be heated above the required temperature due to conductive and radiative heat from the wall and the source and, as such, a substrate cooling system may optionally be included. In one example, a cooler can include a Cu substrate holder with a liquid circulation channel coupled to a Neslab chiller. Silicone liquid can be used as a coolant since regular water or a mixture of ethylene glycol may boil at temperatures in the range of 300 to 450° C.

The resulting film morphology and grain size within films are not only be controlled by the evaporant surface mobility, but also by the substrate temperature and extrinsic parameters such as the vapor deposition angle and deposition rate. As morphology determines the optical transmission and scattering losses in the grown material, precise control of these parameters is important to obtaining high quality growth. The rate of deposition and the stoichiometry of the film, on the other hand, are determined by the relationship between the substrate, the wall, and the source boat temperatures. Optimization of this relationship is therefore important for successful scintillator growth. Again, to produce high quality films the relationship $T_{wall} > T_{source} > T_{substrate}$ is maintained.

Formation of protective coatings atop the deposited material may be performed in situ; i.e., without breaking the vacuum, after completion of the scintillator film deposition cycle. This can include use of an evaporator equipped with sources of protective and reflective materials. An alternate approach is a specialized substrate holder equipped with a spring-loaded window. The window remains open during the scintillator film deposition and is closed after the deposition, before the vacuum is broken with dry N$_2$ gas (typically used to leak the vacuum), using a mechanical trigger located outside of the evaporation chamber. The closed substrate holder, filled with the dry N$_2$, is quickly transferred to a dry chamber for storage.

Protective coatings, such as a para-xylylene polymer composition (e.g., Parylene) coating, can be used as a hermetic sealing layer on scintillator films. Para-xylylene polymer has a very low density and low atomic number, so the incident X-ray/gamma-ray flux is not appreciably attenuated in this coating. An approximately 5 μm thick coating is formed by vapor deposition. A reflective layer of aluminum can similarly be deposited on top of the polymer layer. Alternatively, a top cover with a white Teflon reflector can be emplaced with epoxy.

A hot wall evaporation apparatus, according to another embodiment of the present invention, is described with reference to FIG. 2. The apparatus 40 includes an evaporation chamber 42 having a top portion and a bottom portion, with chamber wall(s) 44 disposed therebetween. The top portion includes a substrate holder 46, and the bottom portion includes a source reservoir 48 or boat. The apparatus 40 includes a resistive heating system 50 coupled to the chamber to apply heating. During deposition, the heating system 50 is activated to maintain the temperature relationship of $T_{wall} > T_{source} > T_{substrate}$ for at least a portion of the deposition process. The system 50 can include a feedback-type monitoring or temperature control system to maintain the desired temperature relationship, and may include one or more thermocouples 52, 54.

Figure 3:
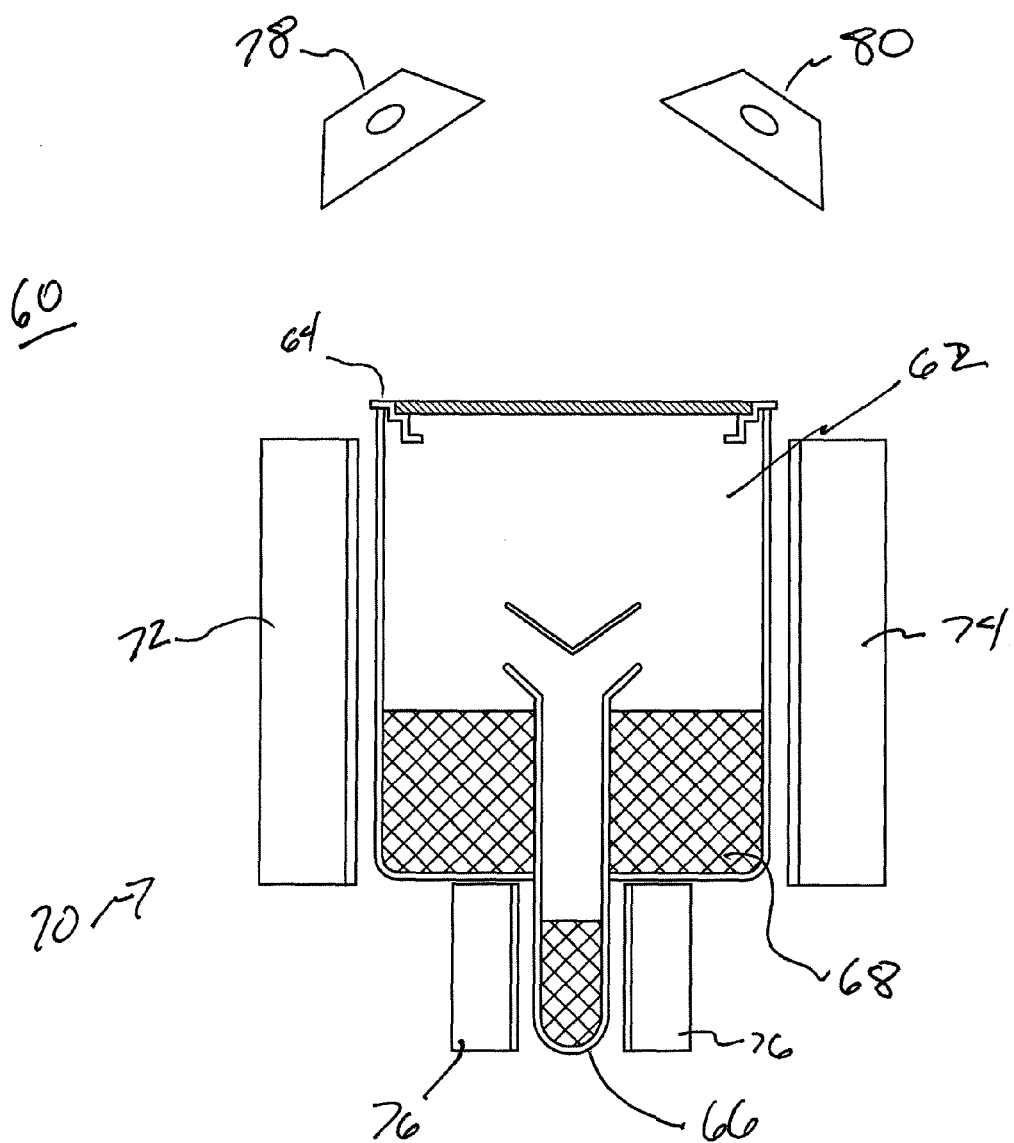
FIG. 3 illustrates an evaporation apparatus according to yet another embodiment of the present invention.

FIG. 3 illustrates a hot wall evaporation apparatus according to yet another embodiment. The apparatus 60 includes an evaporation chamber 62 with a substrate holder 64 at a top portion and source material boats at a bottom portion. The source boats include a first boat 66 (e.g., dopant charge boat) positioned within a second boat 68 (e.g., main component charge boat). As illustrated, the first boat 66 extends axially through the second boat 68, with a bottom portion of the first boat 66 extending below a bottom portion of the evaporation chamber or second boat 68. The apparatus 60 includes a heating system 70, including main heaters 72, 74 extending along the walls of the chamber 62 and positioned so as to heat the chamber walls and source material within the second boat 68. Heating of a substrate positioned in the holder 64 may occur due to heating from the main heater. The heating system 70 further includes a heater(s) 76 coupled to the first boat, and can further optionally include substrate heaters 78, 80. As above, the heating system is activated to maintain the temperature relationship of $T_{wall} > T_{source} > T_{substrate}$ for at least a portion of the deposition process.

Figure 2:
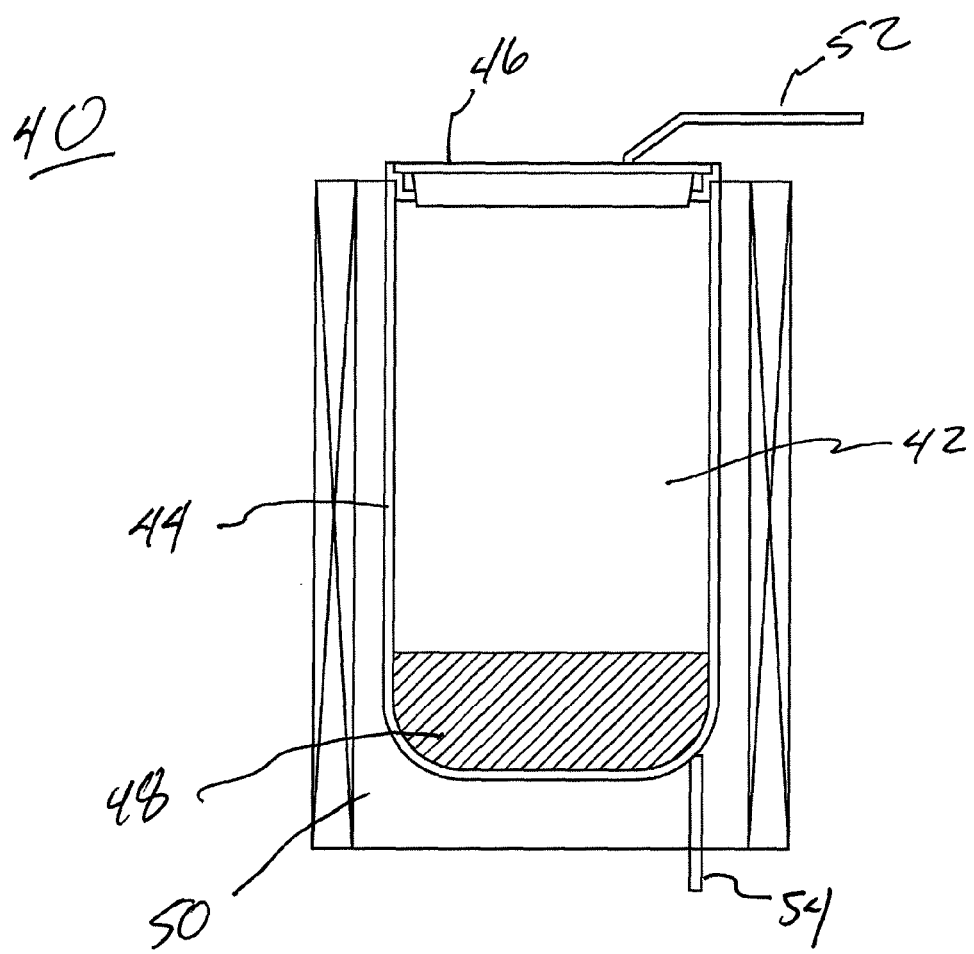
FIG. 2 illustrates an evaporation apparatus according to another embodiment of the present invention.

Component temperature ranges for use of the apparatus of FIG. 2 in fabrication of polycrystalline LaBr3:Ce, as an illustrative example, are described. As noted, LaBr3 has a melting point of about 783 C, which is higher than that of CeBr (e.g., 720 C). Therefore, the LaBr3:Ce source temperature can be in the range of 820 C to 980 C. The wall temperature should be in range of 860 C to 1175 C, and the substrate temperature should be 390 C to 625 C.

In the of polycrystalline LaBr3:Ce fabrication example, component temperature ranges for use of an apparatus as in FIG. 3 can include the following: LaBr3 has a melting point of about 783 C. Therefore, the LaBr3 source temperature (main component charge) should be in the range of 820 C to 980 C. The CeBr3 melting point is 720 C therefore, the CeBr3 (dopant charge) source temperature should be in the range of 750 C to 870 C. The wall temperature should be in range of 860 C to 1175 C, and the substrate temperature should be 390 C to 625 C.

In the lanthanum halide scintillator example, heating of up to about 1200-1600 degrees C. is applied to the second boat or main component charge (e.g., lanthanum halide source material), and dopant heater applies heating of up to about 1200-1600 degrees C. to a dopant charge in the first boat. Walls of the chamber are heated above the temperature of the source materials, whereas substrate temperature is selected to be below the main component charge temperature. Substrate temperature can be up to about 800 degrees C., e.g., in the absence of an activated substrate heater. Substrate temperature can be selected relative to the temperature of the main component charge, and in one embodiment, be 100-200 degrees or more below the main component charge temperature.

As set forth above, scintillator compositions of the present invention may find use in a wide variety of radiation detection and processing applications and structures. Thus, the present invention includes methods and structures for detecting energy radiation (e.g., gamma-rays, X-rays, neutron emissions, and the like) with a scintillation detector including the scintillation composition of the invention.

Figure 4A:
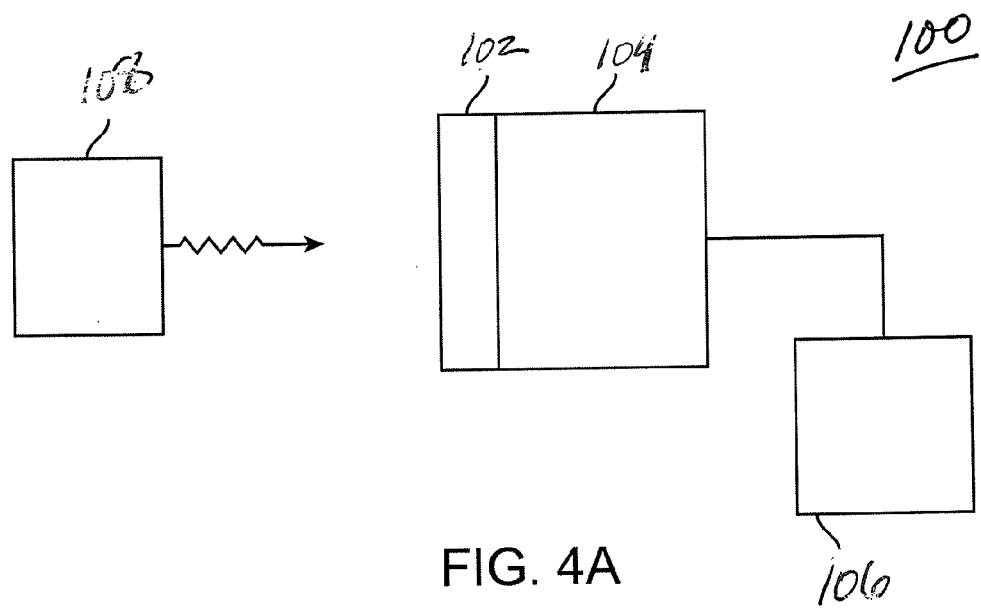
FIG. 4A is a conceptual diagram of a radiation detection system of the present invention.

FIG. 4A is a diagram of a radiation detection system or apparatus including a scintillator of the present invention. The detector system 100 includes a scintillator 102 optically coupled to detector assembly 104 including a light photodetector assembly or imaging device. The detector assembly of system 100 can include a data analysis or computer system 106 (e.g., data acquisition and/or processing device) to process information from the scintillator 102 and detector assembly/photodetector 104. In use, the detector 100 detects energetic radiation emitted form a source 108.

A system as in FIG. 4A containing the scintillator composition (scintillator 102) of the present invention is optically coupled to the detector assembly 104 (e.g., photodetector) and can include an optical window that can be disposed, e.g., at one end of the enclosure-casing. The window permits radiation-induced scintillation light to pass out of the scintillator composition assembly for measurement by the photon detection assembly or light-sensing device (e.g., photomultiplier tube, etc.), which is coupled to the scintillator assembly. The light-sensing device converts the light photons emitted from the scintillator into electrical pulses or signal that are output and may be shaped, digitized, or processed, for example, by the associated electronics.

A data analysis, or computer system thereof can include, for example, a module or system to process information (e.g., radiation detection data or signals) from the detector/photodetectors can also be included in an invention assembly and can include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in a tangible media such as a memory, a digital or optical recording media, optical, electrical, or wireless telemetry signals, or the like, and one or more of these structures may also be used to transmit data and information between components of the system in any of a wide variety of distributed or centralized signal processing architectures.

The detector assembly typically includes material formed from the scintillator composition described herein (e.g., one or more scintillator crystals). The detector further can include, for example, a light detection assembly including one or more photodetectors. Non-limiting examples of photodetectors include photomultiplier tubes (PMT), photodiodes, CCD sensors, image intensifiers, and the like. Choice of a particular photodetector will depend in part on the type of radiation detector being fabricated and on its intended use of the device. In certain embodiments, the photodetector may be position-sensitive.

Figure 4B:
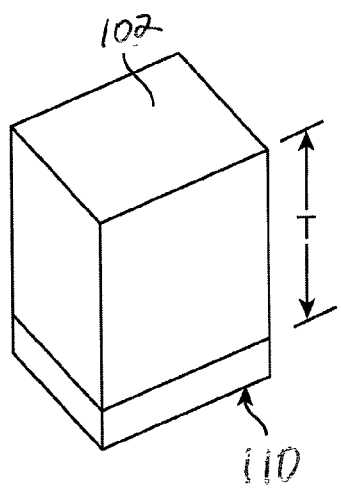
FIG. 4B is a diagram of a scintillator composition disposed on a substrate, according to an embodiment of the present invention.

FIG. 4B shows a scintillator as in scintillator 102 illustrated in FIG. 4A. Scintillator 102 includes a hot wall evaporation system fabricated scintillator as described above. Various sizing, shapes, dimensions, configurations of scintillator 102 may be selected depending on intended use and/or system in which the scintillator 102 is incorporated. Scintillator 102 includes a top side and an opposing side (not shown) with a thickness ("T") measuring between the top side or surface of the scintillator 102 and the opposing side or surface. As noted above, scintillators of the present invention can include substantially thick scintillators, as well as large area scintillators of a variety of sizes, shapes, and/or configurations. Scintillator 102 is shown coupled to a substrate 110, which may be selected from a variety of substrates. Non-limiting substrate composition examples may include amorphous carbon, glassy carbon, graphite, aluminum, sapphire, beryllium, or boron nitrate. A substrate may include a fiber optic plate, prism, lens, scintillator, or photodetector. The substrate can be a detector device or portion or surface thereof (e.g., optical assembly, photodetector, etc.). The substrate can be separate from a detector device and/or comprise a detector portion (e.g., scintillator panel) that can be adapted to or incorporated into a detection device or assembly. In one embodiment, the scintillator is optically, but not physically, coupled to a photodetector.

Experimental investigation demonstrated the feasibility of fabricating scintillators, particularly polycrystalline $LaBr_3$:

Ce scintillators, according to the invention methods using evaporation of source material(s) (e.g., evaporation of crystalline LaBr$_3$:Ce, co-evaporation of LaBr$_3$ and CeBr$_3$) onto a suitable substrate, and further established the usefulness of resulting scintillator product for radiation detection applications, including high resolution radioisotope identification applications. In one embodiment, use of LaBr$_3$ and CeBr$_3$ salts as a source material significantly simplifies the fabrication process and dramatically reduces the cost of the resulting material. Methods of the present invention will include those to fabricate very thick material needed for detecting γ-rays, e.g., up to 3 MeV. Initial testing focused on fabricating ~1 cm thick slabs on 2.5×2.5 cm$^2$ substrates for analysis of scintillation characteristics for compositions of the present invention, with results further demonstrating that thicker and larger area scintillators can be fabricated using the methods of the invention. Technologies to protect the material from atmospheric moisture before and after growth (e.g., by HWE) were also developed.

In general, thick film deposition is extremely challenging, particularly for materials such as LaBr$_3$:Ce that are highly corrosive in nature and may permanently damage vacuum equipment if not contained to a localized region in the evaporator. Furthermore, the physical and chemical properties of the constituent materials used for evaporation differ among different compositions, adding unpredictability and unique challenges. This is particularly at issue under high vacuum, high temperature deposition conditions, which may cause a significant imbalance of stoichiometry and could produce non-scintillating material. Finally, materials such as LaBr$_3$:Ce that are deliquescent (hygroscopic) in nature add additional challenges, with the hygroscopic nature causing problems of non-radiative defects in the crystal lattice and quenching of luminescence if exposed to moisture. In the extreme case, LaBr$_3$:Ce will dissolve in the absorbed moisture to form a pool of liquid.

In spite of significant challenges in generating polycrystalline LaBr$_3$:Ce scintillator, present structures and techniques have been utilized to successfully fabricate polycrystalline LaBr$_3$:Ce scintillator, and in some respects fabrication of scintillator that significantly exceeded expectations in terms of results and performance. In particular, for the first time methods described herein have demonstrated fabrication of a polycrystalline LaBr$_3$:Ce scintillator using evaporation techniques, including fabrication of thicker and larger area scintillators. In one example, translucent/transparent polycrystalline films measuring 7 cm in diameter and approaching a thickness of 1 cm using very low cost, relatively unpurified, starting material. In terms of their scintillation properties, newly developed films as described herein have shown as much as 155% of the light of a standard commercial LaBr$_3$:Ce crystal (Saint-Gobain Crystals (Hiram, Ohio)), which is believed to be the highest among reported data. Also, the films have demonstrated remarkably fast scintillation decay, in one example on the order of 8 ns, which is faster than that reported in literature for single crystals. Films have demonstrated remarkable afterglow characteristics comparable to that of a crystalline material, indicating that a process of vapor deposition as described herein does not introduce any significant defect states that could compromise their speed. Additionally, in one example the material showed emission centered at about 360 nm and excellent proportionality over the wide γ-ray energy range comparable to crystalline LaBr$_3$:Ce.

Methods have further been developed to successfully encapsulate films in order to protect them from atmospheric moisture, including a new technique to do so using compositions such as Parylene C, which may be implemented in the same apparatus used for vapor deposition. Collectively this represents a considerable advancement and very significant results. Methods described herein can be utilized to generate films having increased thickness, higher transparency, and superior response uniformity, and hence a correspondingly higher sensitivity and energy resolution for incoming γ-radiation. Thus, the present techniques have successfully demonstrated the feasibility of producing large volumes of sizeable LaBr$_3$:Ce crystals and films using vapor deposition techniques described herein in a time- and cost-effective manner.

Several different constructions of HWE systems/hardware were designed and tested. Hardware was assembled for installation inside of a high-vacuum vapor deposition system. Exemplary systems or HWE apparatus are described further herein (see, e.g., FIGS. 1-3). In one example, the vacuum system was equipped with a 24 inch diameter stainless steel bell jar, roughing pumps and a high vacuum cryopump, vacuum gauges, two evaporation boats, the necessary power supplies, feed-throughs, and crystal monitors. The main hardware components that were added to this system included an HWE column with appropriate conformal resistive heaters surrounding the walls, and a substrate holder.

Studies were conducted to examine the influence of vapor deposition parameters on the properties of LaBr$_3$:Ce films formed by the evaporation of source materials, including co-evaporation of LaBr$_3$ and CeBr$_3$ for formation of polycrystalline LaBr$_3$:Ce scintillator. The initial results demonstrated, among other things, that a film deposited using a cooled or cooler substrate (e.g., substrate less than about 350 degrees C.) does not have the desired density and produces highly amorphous structures, which result in a lower γ-ray absorption efficiency and lower light output, respectively, than desired or useful. Also, the deposition efficiency in a system operated with a cooled substrate was found to be unacceptably low—only about 10%, which indicated a high degree of inefficiency at cooler substrate temperatures, thereby requiring use of large quantities of starting materials to achieve the desired thickness. Additionally, without proper chamber sealing the evaporated material, other than that deposited on the substrate, would be released into the vacuum chamber, allowing it to corrode system parts. Consequently, thorough system cleaning after every deposition was mandatory to prevent any system damage.

Additional evaporation systems were assembled to deposit LaBr$_3$:Ce films onto a heated substrate and to substantially confine the evaporated material to the HWE chamber. One prototype HWE system included a heated copper substrate holder placed on a quartz cylinder, which formed the "hot wall" of the HWE apparatus when heated using an external heater. It was determined that when the condition $T_{wall} > T_{source} > T_{substrate}$ is met, the system allows deposition of polycrystalline, transparent, higher density LaBr$_3$:Ce film on a suitable substrate. The specially designed holder of the HWE system not only allows substrate temperature control, but also permits rapid installation and dismounting of electrical contacts and the thermocouple, which helped ensure that the films may be quickly transferred to a dry box for storage or for hermetic sealing. The heated quartz tube prevented adhesion of evaporated LaBr$_3$ and CeBr$_3$ to the walls, but directed the LaBr$_3$:Ce molecules towards the substrate, the coolest part in the system. This type of design produces a directional flow of the vapors during deposition, thereby increasing the deposition efficiency and preventing the otherwise prevailing material wastage.

In one example, a system was installed inside the vacuum chamber and several deposition runs were conducted to produce LaBr$_3$:Ce films of thickness varying from 0.3 to 0.8 mm, or more. Regarding process variation, temperature variation and combinations were examined, creating combinations of relationships between the source, wall, and substrate temperatures, respectively. In another set of experiments, alteration in film composition was attempted by varying the amount of Ce dopant concentration. These variations resulted in producing an ensemble of $LaBr_3$:Ce films with 5 to 30% Ce. Resulting $LaBr_3$:Ce film were generated and placed inside the dry box just prior to the sealing process, and subsequently sealed to produce a sealed scintillator film. Scanning electron micrographs (SEMs) were taken and examined.

In one example, a HWE system design produced a substantially uniform substrate temperature across a substrate but resulting in a cooler region (<300 degrees C.) where the substrate flange met the heated quartz cylinder. Consequently, in this example, the material preferentially deposited on the cooler walls and negatively impacted substrate deposition efficiency, producing a substrate deposition efficiency of 30% compared to the desired 90+%. It was determined that deposition efficiency can be increased by better avoiding regions or cool spots of the walls of the HWE chamber with a lower temperature that elicits substantial material deposition on the chamber walls, rather than the target substrate deposition surface. While the deposition efficiency in this system prototype was significantly better than the 10% achieved with a preliminary system using more conventional deposition hardware, such as used for CsI"T1 deposition, as described above, system/design modifications were made in order to address the lower than desired substrate deposition efficiency. Despite deposition efficiency concerns, this prototype system nevertheless produced robust films that demonstrated scintillation and provided guidance for further design considerations.

Various HWE systems have been designed to better address issues of deposition efficiency, system corrosion, vapor escape compared to conventional hardware and/or initial prototype designs. One exemplary design utilized for fabrication and testing of scintillator is illustrated with reference to FIG. 2. This HWE design illustrated in FIG. 2 includes, among other things, several notable features, including a specially designed substrate holder and a completely enclosed hot wall chamber. The substrate holder includes a design that provides adequate sealing of the chamber, substantially prevents vapor escape, and provides exposure of the substrate deposition surface to the source vapor, and permits growth of a highly uniform film of large diameter or area and substantial thickness. In one example, the HWE design was used to fabricate highly uniform $LaBr_3$:Ce films with a 7 cm diameter and up to 1 cm thickness, and demonstrated suitability of fabrication of even larger and/or thicker film. The enclosed hot wall chamber is coupled to a heating system so as to minimize cool spots or regions, includes a wall composition and heating capacity to ensure very high material deposition efficiency and protection of the surrounding vacuum system by preventing material leakage.

As noted, a HWE system as in FIG. 2 was utilized for successful deposition of thick films that were found to be translucent and exhibiting the polycrystalline nature of the internal structure, which was confirmed by the SEM analysis. The enhanced transparency and polycrystalline nature of the film was attributed at least partially to elevated substrate temperature during deposition in the completely closed HWE system, controlled evaporation rate, and gradual cooling of the film after deposition. In one example, high-quality films were fabricated with a measured deposition temperature was ~440° C., with improvements in transparency, film density, and polycrystalline nature expected with further increase in substrate temperature. Higher substrate temperatures can also enhance thickness and performance uniformity across the large diameter area of the film. With use of additional substrate modulation means, such as additional substrate heating, substrate temperatures could be raised to as high as 600° C., while maintaining the relationship $T_{wall} > T_{source} > T_{substrate}$.

Scintillator fabrication produced thick, large area films at above 90% deposition efficiency with little or no observed material leakage into the vacuum chamber during an HWE run. Scintillator deposition, as noted, can further include incorporation of additional substrate heating means. Resulting film morphology and grain size within films may not only be controlled by the substrate temperature, but also by the evaporant surface mobility and extrinsic parameters such as the vapor deposition angle and deposition rate. As morphology determines the optical transmission and scattering losses in the grown material, precise control of those parameters can be important for obtaining high quality, transparent, polycrystalline growth. The rate of deposition and the stoichiometry of the film are determined at least partially by the relationship between the substrate, wall, and source boat temperatures. Optimization of this relationship is therefore important for obtaining desired deposition rate and stoichiometry during fabrication. Again, to produce high quality polycrystalline films the relationship $T_{wall} > T_{source} > T_{substrate}$ is maintained during future deposition runs rather than just raising and regulating the substrate temperature.

In addition to the HWE systems development and thick film depositions, the present invention includes hermetic seal/encapsulation techniques and structures to protect the film from atmospheric moisture and mechanical damage during normal handling. Due to the highly hygroscopic nature of the $LaBr_3$:Ce material, for example, and precursors $LaBr_3$ and $CeBr_3$, special precautions must be observed at every step of the deposition process, including raw material loading into the HWE system, installing the HWE system in the vacuum chamber, and during the unloading of the vapor-deposited films. The raw materials are typically kept in a dry box with <1% relative humidity, and loading can, in some instances, be done in the dry nitrogen atmosphere inside the dry box as well. After deposition the unloading and sealing of the films can be performed inside the same dry box. Such precautions can help ensure that the starting materials and films were never exposed to atmospheric moisture.

In some examples, films were deposited on fiberoptic substrates for subsequent sealing, as fiberoptic substrate deposition made hermetic sealing more practical for analysis. Sealing was accomplished in one example using a prefabricated aluminum frame, machined using an appropriately sized piece of aluminum, to form a step whose depth was slightly higher than the thickness of the fiberoptic substrate plus the $LaBr_3$:Ce film atop it. The thickness of the aluminum window through which the incident radiation would enter the film was kept at ~1 mil (25 μm) thickness to minimize γ-ray/X-ray attenuation. After deposition, the films were placed inside the aluminum cap and sealed using a commercial hermetic sealant.

Several techniques to hermetically seal deposited films were performed. One method utilized permitted the use of a non-transparent substrate (e.g., substrates other than a fiberoptic substrate) for film deposition, and also allowed formation of protective coatings in situ; i.e., without breaking the vacuum, after completion of the $LaBr_3$:Ce deposition cycle. Furthermore, this technique eliminated the need for the aluminum housing described above, and allows protection of films of any shape and size, as well as providing flexibility in coupling the scintillator to a photodetector. Evaporation systems can be equipped to firm an in situ protection, or protection and evaporation can be performed at different locations. In one example, LaBr$_3$:Ce films were fabricated in an evaporator and then transported to a Parylene C coater under a dry N$_2$ shower. Parylene C (a plastic-like polymer) has a very low density and low atomic number, so the incident X-ray/γ-ray flux is not appreciably attenuated in this coating. An approximately 10 μm thick coating was formed by vapor deposition to provide adequate hermetic sealing. Several specimens were subjected to Parylene C coating and tested by exposing them to atmospheric humidity. In one of the tests, a "control" piece of LaBr$_3$:Ce recovered from the deposition chamber was placed next to the Parylene C coated specimen. As expected, the unprotected LaBr$_3$:Ce deliquesced into a puddle in just a few minutes. In contrast, the protected piece remained intact and was found have the same scintillation properties even after 5 weeks of exposure to ambient conditions. Table I shows relative light yield of a parylene coated LaBr$_3$:Ce film showing no significant variation in light output after 4 weeks of exposure to room temperature conditions.

TABLE I

| Weeks After Parylene Coating | Light Yield (Area Under The Emission Curve) | Relative Light Output |
| --- | --- | --- |
| 0 | 4.56 × 10$^6$ | 100% |
| 2 | 4.91 × 10$^6$ | 108% |
| 4 | 4.53 × 10$^6$ | 99% |

Scintillator compositions and assemblies of the present invention can further include one or more reflective coatings, e.g., formed on a substrate surface or otherwise coupled with a scintillator. In one embodiment, a reflective coating can be formed on a substrate surface prior to LaBr$_3$:Ce deposition, such as in the case of opaque substrates. One embodiment includes use substrates such as alumina that are themselves white in color and act as an excellent reflector. For graphite-like substrates, reflective metal coatings can be formed. In addition to being highly reflective, such coatings must withstand high process temperatures, maintain adhesion to the substrate during and after deposition, and be chemically inert with LaBr$_3$:Ce or suitable for coating with a chemically inert material, such a organic polymer or resin (e.g., parylene, Paralyen C). For transparent substrates a reflective coating can be applied atop the LaBr$_3$:Ce film directly or after deposition of one or more other coatings, such as a parylene coating. As noted above, various coating technologies can be utilized for forming coatings with the required optical and/or protective properties.

Analysis and testing of scintillation characteristics of films fabricated according to the inventive methods was performed. As noted, present methods and structures were utilized to produce large-area and substantially thick polycrystalline LaBr$_3$:Ce films. Films were produced having a range of dopant concentrations, e.g., from about 5% to about 30% Ce, for testing. Produced films demonstrated segregation of impurities during deposition, and produced translucent to transparent polycrystalline material. Remarkably, films produced substantially exceeded a goal of achieving an approximate 35% light conversion efficiency in vapor deposited material, compared to single crystals from commercially available sources (e.g., about 63,000 photons/MeV). Films deposited according to the present invention demonstrated light yield that actually exceeded that of commercially available single crystal sources, in some instances demonstrating light yield of up to about 155% of commercially available LaBr$_3$:Ce crystals. Spectral emission was demonstrated to be virtually identical to that of LaBr$_3$:Ce crystals. Scintillation decay of LaBr$_3$:Ce films of the present invention was even faster than LaBr$_3$:Ce crystals, showing 4 to 8 ns primary component with ~20 ns secondary component, compared to 16-28 ns reported for the crystalline material, a rather surprising result. Additionally, emission in polycrystalline films of the present invention was essentially free of afterglow, indicating suitability for the invention compositions in detection/imaging applications not previously recognized. Certain testing methodologies and results are described in further detail below.

Spectral Characterization

The X-ray excited emission spectra of the LaBr$_3$:Ce films were measured using the Cu target X-ray generator (8 keV Cu Kα line). To generate the required flux at the sample, the X-ray generator was operated at 40 kV with 20 mA current. The resulting scintillation light was passed through a McPherson model 234/302-0.2 m monochromator and measured. The intensity of each selected wavelength was registered using an RCA model C31034 photomultiplier tube (PMT). The operation of the whole instrument, including the X-ray trigger, the rotation of the monochromator to select the wavelengths, and the data acquisition and analysis, was software controlled.

Resulting emission spectra were obtained from three deposited films (LaBr$_3$:Ce film with 13% Ce; LaBr$_3$:Ce film with 21% Ce; LaBr$_3$:Ce film with 50% Ce) and compared to the emission of a standard LaBr$_3$:Ce crystal with approximately 5% Ce concentration (data not shown). Results indicated the following: the mechanism responsible for the luminescence in films operates in the same manner as the crystalline material, and verifies the efficacy of growing efficient scintillators using HWE growth; the HWE method can be used to effectively control the Ce dopant concentration in the film; and various deposition temperatures (source, wall, and substrate) are important parameters that could influence the segregation of impurities and promote polycrystalline growth.

Figure 5:
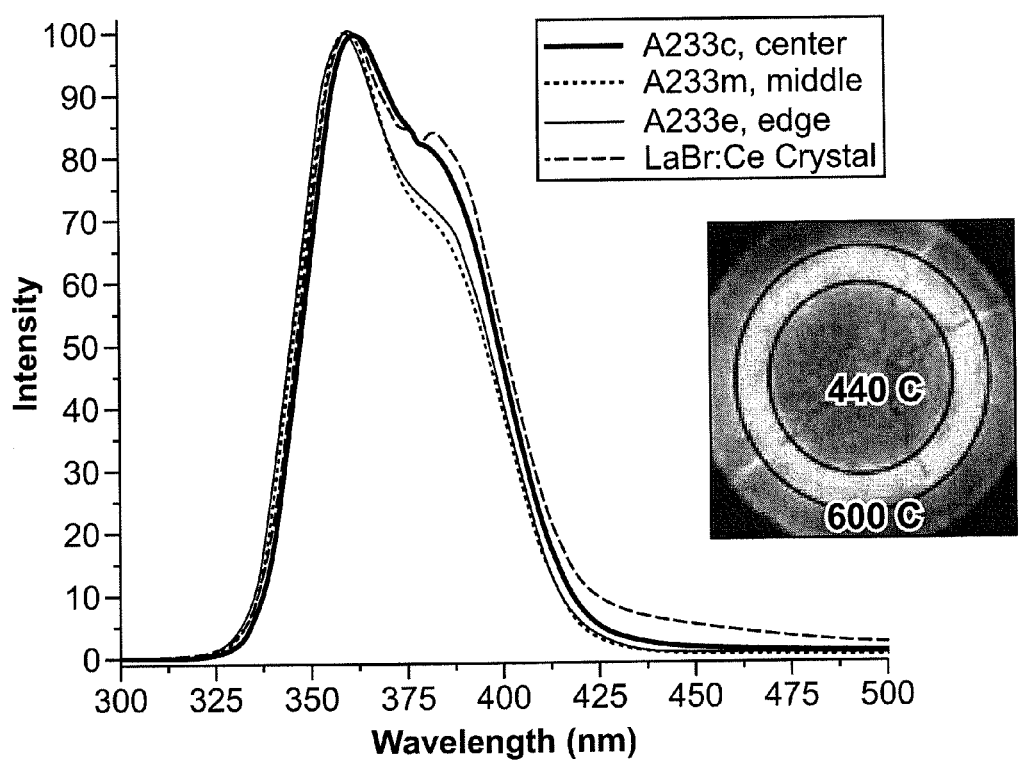
FIG. 5 illustrates an emission spectrum, under continuous x-ray excitation, for LaBr3:Ce film developed according to the deposition methods described herein. Data from three concentric regions in the film are shown. The corresponding data for a commercial LaBr3:Ce crystal from Saint-Gobain is plotted for comparison.

Film deposition at higher substrate temperatures provided a film morphology is more polycrystalline than amorphous, compared to film deposition at lower temperatures, with higher substrate temperature deposition also demonstrating better segregation of impurities. Also, the high temperature depositions brought the film stoichiometry closer to that of the crystal, as was evidenced by a bright emission (further described below) and similarity between the film and crystal emissions shown in FIG. 5. FIG. 5 shows emission spectrum, under continuous X-ray excitation, for LaBr$_3$:Ce film deposited at higher substrate temperatures. The data from three concentric regions in the film corresponding to different substrate deposition temperatures are shown—data is plotted in FIG. 5, with concentric regions shown in the inset of FIG. 5. The corresponding data for a commercially available LaBr$_3$:Ce crystal from Saint-Gobain is plotted in FIG. 5 for comparison.

X-Ray Diffraction Analysis

X-ray diffraction measurements were performed using a Bruker (Germany) D8 Focus diffractometer operating at 40 kV and 40 mA. The specimens we used were from one of the earlier vapor deposition runs from at high temperature depositions, as illustrated in FIG. 5 inset showing concentric regions in the film corresponding to different substrate deposition temperatures. The substrate temperature in the selected run varied from lowest in the center of the film (440° C.) to the highest at the edges (600° C.), and provided excellent specimens to study the effect of temperature on the deposited material.

All three specimens showed the existence of $LaBr_3$:Ce, without any contaminants. The specimen from the central (lowest deposition temperature) region predominantly showed the presence of $LaBr_3$ along with the other two phases, $LaBr_2$ and $LaBr_5$ respectively. As in the case of the central region, the specimen from the middle and relatively hotter region also showed the presence of all three phases of lanthanum bromide, however with slightly varied percentages. The specimen from the edge region, where we estimated the temperature was the highest, showed the presence of the desired $LaBr_3$ phase, but a complete absence of the other two phases. This suggests that the specimens from the edge region are highly oriented crystals, which could be observed visually from their transparency and appearance. However, these crystalline samples did not demonstrate the highest scintillation, possibly indicating that the substrate temperatures should be maintained within a certain specified range and that the higher substrate temperature (above an optimal high-temperature range) may not necessarily further enhance scintillation yield. Conducting depositions at substrate temperatures above and below this range would adversely affect the light yield.

The other important observation is that the XRD data did not show the presence of a $CeBr_3$ phase in any of the specimens, indicting that $CeBr_3$ might have complete solubility in $LaBr_3$. This is an important conclusion derived from the fact that the starting $LaBr_3$ material was loaded with 15% of $CeBr_3$ to produce the film used for these investigations. This high solubility would permit creating compositions that may provide as yet unachievable scintillation. In other words, the absence of observed $CeBr_3$ peaks suggests complete solubility of $CeBr_3$ in $LaBr_3$, creating possibility of producing $LaBr_3$:Ce compositions with even higher scintillation efficiency than observed in analysis thus far.

Thus, the measurements outlined above give insight into the vapor phase growth process and confirm initial conclusions that optimized depositions should be performed by controlling the substrate temperature in a range around 450 C, while maintaining the desired relationship between the source, the wall, and the substrate temperatures as noted. In some HWE system designs, differential or selective cooling/heating of different substrate portions (e.g., cooling of the substrate edges) may be desired in order to bring temperature uniformity across the substrate area.

Light Yield Measurements

Light yield measurements were performed using gamma-ray spectroscopy of the thick $LaBr_3$:Ce films and compared to both a commercial $LaBr_3$:Ce crystal from Saint-Gobain and a commercial BGO (bismuth germanate oxide) crystal. For these measurements, the specimens were optically coupled to a Photonis PMT (model XP2203B) and were exposed to Co57 and Am241 isotopic sources. The signal from the detector was processed using standard NIM electronics (Canberra model 2021 spectroscopy analyzer), and the spectra were recorded using an Amptek MCA and a computer.

Energy spectra measured using $LaBr_3$:Ce films fabricated with initial prototype equipment that included material deposition at lower substrate temperatures (data not shown). Even in this early stage of development films achieved a light signal 5 times greater than standard BGO, and half the signal of the standard $LaBr_3$:Ce crystal. This is a very significant result, that the non-optimized, translucent films have produced such a high light output. The light yield of the commercial LaBr3:Ce crystal was approximately 63,000 photons/MeV, so the calculated light yield of some initial films that were tested was already on the order of 30,000 ph/MeV. Keeping in mind that comparison was between non-optimized thick films and a packaged, fully transparent, commercially available LaBr3:Ce crystal from Saint-Gobain, this is a remarkable accomplishment at an early stage of development. The fact that a thick sample that was white and translucent, and yet still produces a photopeak with good signal shows that the intrinsic light output must be very high indeed. As demonstrated below, higher temperature depositions enhanced transparency in the specimens and substantially enhanced the light yield.

Figure 6:
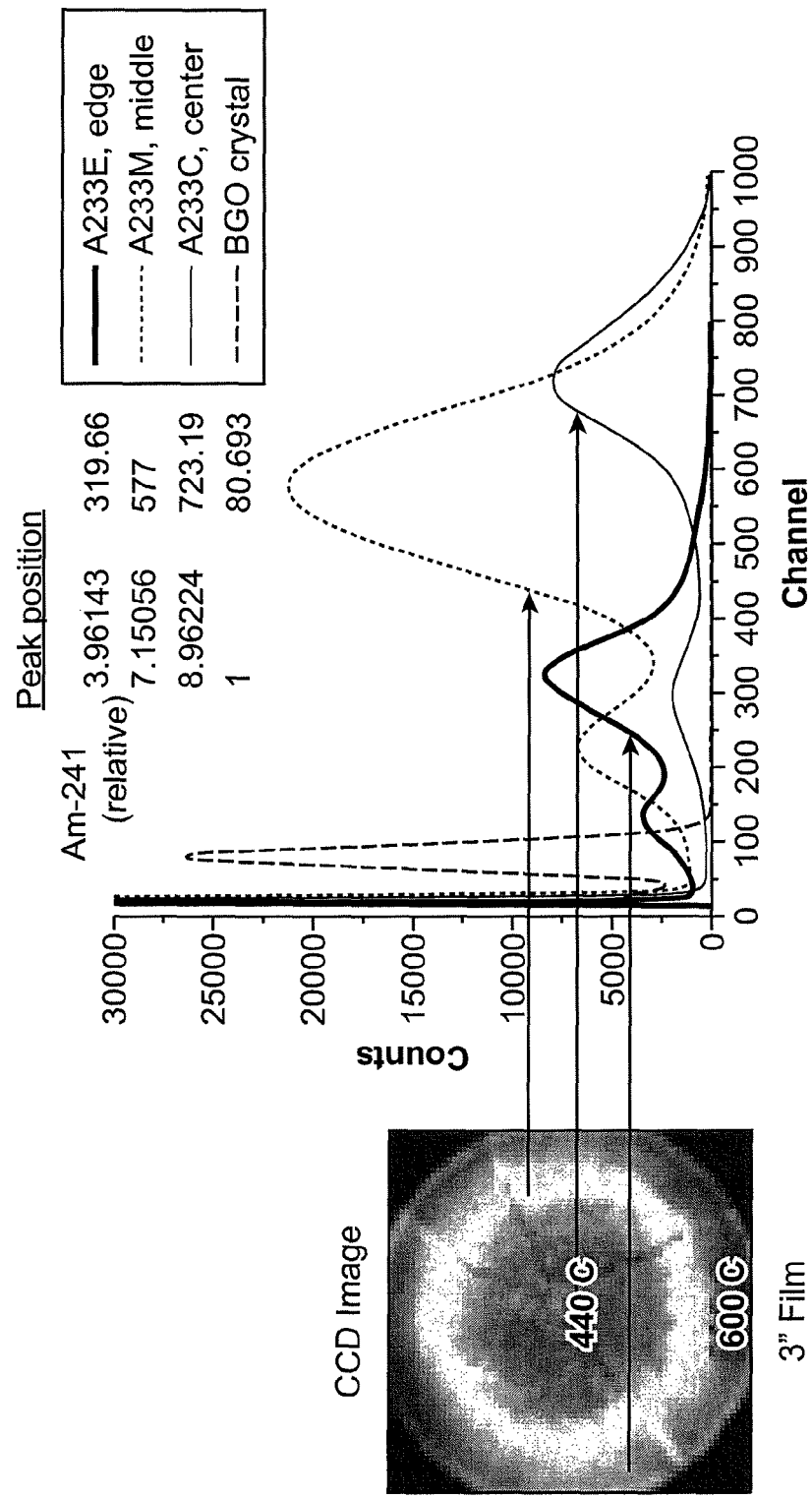
FIG. 6 show light output data over an entire area of a LaBr3:Ce film under x-ray excitation, as imaged by a CCD camera. Three distinct zones in the light yield correspond to the substrate temperature in respective zones during deposition (center zone corresponds to a substrate temperature of about 440° C.; outer zone corresponds to substrate temperature of about 600° C.). Amplitude variations are due to different time periods over which the data were collected.

To achieve further enhancements in scintillation yield, films were deposited at higher substrate temperature and influence of substrate temperature on scintillation yield was examined. To demonstrate the effect of substrate temperature during deposition on the emission efficiency of the resulting $LaBr_3$:Ce films, light yield from various regions of the same film used for X-ray diffraction measurements shown in FIG. 6. As mentioned before, this film demonstrated three concentric zones (see FIG. 6 offset) with varying degrees of emission efficiency depending on the local substrate temperature at the time of deposition. FIG. 6 shows three distinct light yield zones imaged using a CCD camera and the corresponding light yield measured using the PMT setup, showing progressive gain in light yield (right shift of the photopeak) with change in the substrate temperature. These data provide further evidence that deposition parameters have a significant influence on the scintillation properties of the resulting film.

Figure 8:
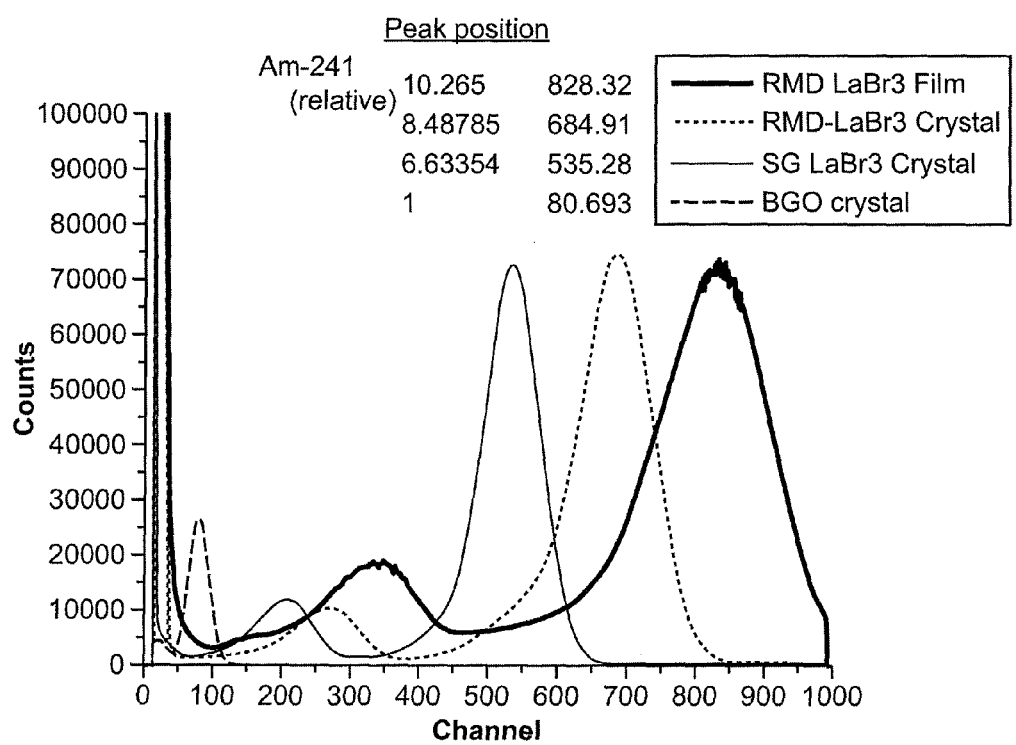
FIG. 8 shows photopeak spectra obtained using HWE high temperature vapor-deposited LaBr$_3$:Ce film, LaBr$_3$:Ce crystals grown; LaBr$_3$:Ce crystals obtained from a commercial source; and a BGO crystal.

The $LaBr_3$:Ce film specimens deposited at higher substrate temperatures were compared to $LaBr_3$:Ce crystals. The 60 keV 241 Am energy spectra was measured using one of the 7 mm thick $LaBr_3$:Ce films deposited at the elevated 440° C. substrate temperature. For comparison, a $LaBr_3$:Ce (1.5×2.0 cm right cylinder, 5% Ce) crystal from Saint-Gobain, a $LaBr_3$:Ce (1.5×2.0 cm right cylinder, 20% Ce) crystal grown at internally, and a commercial BGO scintillator were also used. Results are presented in Table II. Results are further shown in FIG. 8.

TABLE II

| Specimen | Peak Position | Relative Light |
| --- | --- | --- |
| A233P4 RMD Film | 828 | 155% |
| 85-24 RMD Crystal | 685 | 128% |
| Saint-Gobain Crystal | 535 | 100% |
| BGO Crystal | 81 | 15% |

As can be seen, the $LaBr_3$:Ce film showed 155% light compared to the Saint-Gobain crystal and ~122% light compared to the LaBr3:Ce crystal grown internally. Table II additionally lists peak positions and corresponding light yield measured for various crystals. The calculated $LaBr_3$:Ce film light yield was estimated to be 97,500 photons/MeV, the highest light yield ever recorded. This is a remarkable result by any standards, and represented a significant accomplishment.

Linearity Measurements

The proportionality of the vapor-grown $LaBr_3$:Ce films was experimentally measured and compared to that obtained using the crystalline $LaBr_3$:Ce grown internally as well as commercially available crystalline $LaBr_3$:Ce obtained from Saint-Gobain. Energy spectra from the specimens under investigation were acquired by coupling them to the PMT setup and exposing them to 241 Am (60 keV), 122Co (122 keV), 22Na (511 keV), and 137Cs (662 keV) radioisotopes.

Figure 7:
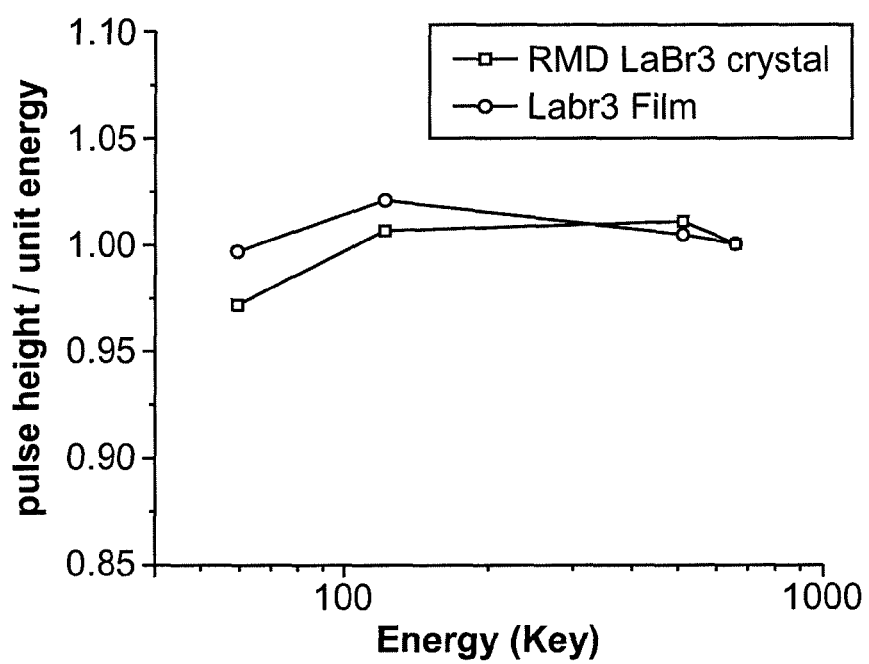
FIG. 7 shows proportionality data for a vapor-deposited LaBr3:Ce film compared to that of a crystal produced using conventional crystal growth methods, illustrating that the vapor deposited film demonstrates response similar to that from the crystal.

For each, gamma ray energy light yield was computed in photons/MeV, and the results were normalized with respect to the value at 662 keV. From these data, nonproportionality over a 60 keV to 662 keV gamma ray energy range was determined. The resulting data is presented in Table III and FIG. 7.

TABLE III

| Specimen | Energy Resolution (%) | | |
|---|---|---|---|
| | 60 keV | 511 keV | 662 keV |
| A233P4 RMD Film | 13 | 8.0 | 9.4 |
| 85-24 RMD Crystal | 11 | 4.2 | 4 |
| Saint-Gobain Crystal | 11 | 3.5 | 3 |

As can be seen, the vapor-deposited $LaBr_3$:Ce film demonstrated excellent proportionality, showing preservation of this characteristic of lanthanide halide scintillators in the vapor deposited specimens.

Afterglow Measurements

Decay time and afterglow measurements were made under the conditions of short (20 ns) excitations as well as excitations typically used during radiographic imaging. Each of these measurements provided unique information, which is being used for understanding the decay kinetics in the evaporated films.

The measurements were performed using an existing experimental setup. Initially, specimens were excited by means of a Golden Engineering XRS-3 source, which provides 20 ns FWHM X-ray pulses with maximum photon energy of 250 kVp. The scintillation response from the specimens was passed through a 0.2-m McPherson monochromator, detected by a Hamamatsu R2059 photomultiplier, and recorded by a Tektronix TDS220 digital storage oscilloscope. Surprisingly, the short pulse data yielded the 1/e decay time of 8 ns from a representative film, which is faster than ~20 ns reported for $LaBr_3$:Ce crystals. The secondary decay was measured at 21 ns, which is within the 16 to 28 ns range reported for $LaBr_3$:Ce crystals.

Figure 9A:
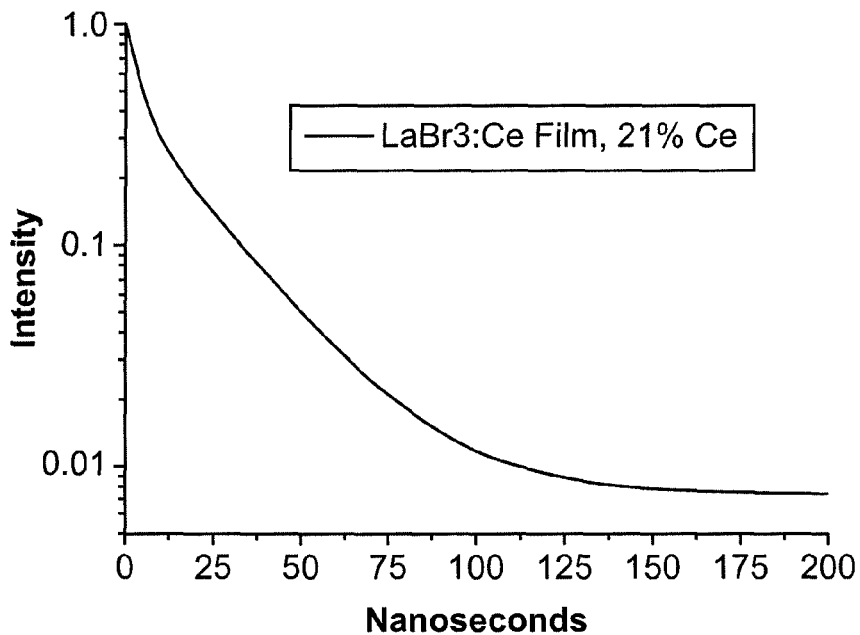
FIGS. 9A and 9B show scintillation decay properties of vapor-deposited LaBr3:Ce films, according to an exemplary embodiment of the present invention.
Figure 9B:
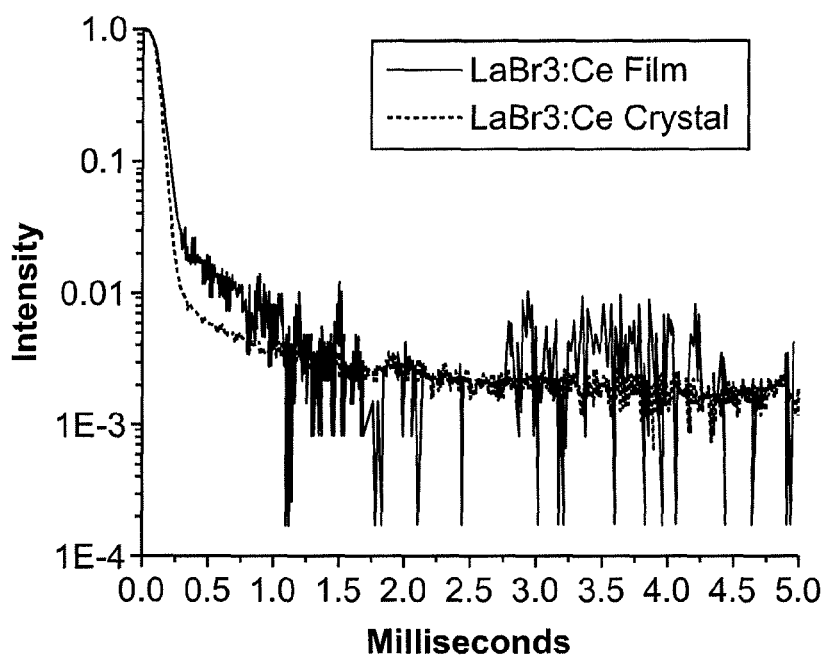

Scintillation decay properties of HWE vapor-deposited $LaBr_3$:Ce films are shown with reference to FIGS. 9A and 9B. Shown in FIG. 9A, short, 20 ns x-ray excitation data showing the primary 1/e decay time of about 8 ns, which is faster than the about 20 ns reported for crystals of this material, a surprising result. The secondary decay, however, is about 21 ns which is within the 16-28 ns range previously reported for $LaBr_3$:Ce crystals. In FIG. 9B, corresponding afterglow measurement obtained using 100 kVp x-rays for a duration of 100 ms. X-ray exposure was approximately 500 mR. Films demonstrate similar behavior compared to the crystals, indicating that the vapor deposition process does not introduce any significant undesirable traps to alter the films' decay characteristics.

The short pulse measurements were followed by measurements extended to longer times and higher exposures to determine afterglow characteristics. Measurements were performed on a representative film and were compared to those from a crystal. The specimens were irradiated with a continuous X-ray beam from an Electromed International CPX 160 X-ray source with 100 kVp X-rays for a duration of 100 ms. The scintillation signal was measured with a fast-response silicon PIN photodiode, Hamamatsu model S3204-8, and transferred via a current-to-voltage converting preamplifier to an oscilloscope. The resulting data (not shown) demonstrated that the afterglow from the film was not degraded compared to that of the crystal, which is an important result since film deposition in other contexts can introduce imperfections that degrade afterglow. In each case, the afterglow is down to 0.5% at 1 ms after X-ray shut off. This is an excellent result, as it shows that there is little buildup of afterglow with the relatively long 100 ms exposure time. This is especially important, as it demonstrates that films of the present invention may be suitable for use these films in X-ray imaging systems such as computed tomography systems, where they may be subject to long exposure times.

The present description typically refers to the large volume fabrication of scintillators using polycrystalline $LaBr_3$:Ce as an exemplary embodiment. However, the described techniques are equally applicable to the fabrication of other compositions, such as lanthanide halide scintillators, including $LaBr_3$:xx (xx: Pr, Tb or Eu), $LaCl_3$:xx (xx: Ce, Pr, Tb or Eu) and $LuI_3$:xx (xx: Ce or Eu), plus other technologically important scintillators such as $SrI_2$:Eu. As such, the fabrication procedures developed using the described methods will be applicable to growing other highly beneficial scintillators in large physical and production volumes, in an economical manner, with formats not possible to achieve using conventional growth techniques.

The specific dimensions of any of the apparatuses, devices, systems, and components thereof, of the present invention can be readily varied depending upon the intended application, as will be apparent to those of skill in the art in view of the disclosure herein. Moreover, it is understood that the examples and embodiments described herein are for illustrative purposes only and that various modifications or changes in light thereof may be suggested to persons skilled in the art and are included within the spirit and purview of this application and scope of the appended claims. Numerous different combinations of embodiments described herein are possible, and such combinations are considered part of the present invention. In addition, all features discussed in connection with any one embodiment herein can be readily adapted for use in other embodiments herein. The use of different terms or reference numerals for similar features in different embodiments does not necessarily imply differences other than those which may be expressly set forth. Accordingly, the present invention is intended to be described solely by reference to the appended claims, and not limited to the preferred embodiments disclosed herein.

What is claimed is:

1. A radiation detection device, comprising a doped lanthanum halide polycrystalline non-columnar scintillator film formed on a substrate, wherein the scintillator film comprises a different lattice structure from that of the substrate.

2. The device of claim 1, wherein the polycrystalline scintillator is formed on a substrate by a process comprising evaporating one or more source materials in an evaporation chamber having one or more heated walls during vapor deposition of the scintillator on the substrate.

3. The device of claim 2, wherein a temperature relationship of $T_{wall} > T_{source} > T_{substrate}$ is maintained for at least a portion of the deposition process.

4. The device of claim 1, wherein the polycrystalline scintillator is a substantially thick, large area scintillator.

5. The device of claim 4, the scintillator having a thickness of about 1 cm or greater.

6. The device of claim 5, the scintillator having an area of 50 $cm^2$ or greater.

7. The device of claim 1, wherein the scintillator comprises $LaCl_3$:Ce, $LaCl_3$:Pr, $LaBr_3$:Ce or $LaBr_3$:Pr.

8. The device of claim 7, wherein the scintillator comprises about 0.01% to about 50% Ce or Pr by molar weight.

9. The device of claim 7, wherein the scintillator comprises a light yield of about 30,000 ph/MeV or more under X-ray excitation.

10. The device of claim 9, wherein the scintillator comprises a light yield of greater than about 90,000 ph/MeV under X-ray excitation.

11. The device of claim 10, wherein the scintillator comprises a 1/e light emission decay time of about 20 ns or less.

12. The device of claim 1, the scintillator having a thickness of about 1 mm to about 1 cm.

13. The device of claim 1, the scintillator having an area of 1 cm² or greater.

14. A method of forming a doped lanthanum halide polycrystalline non-columnar scintillator on a surface of a substrate, comprising:
   providing a hot wall evaporation apparatus comprising an evaporation chamber having one or more chamber walls disposed between a positioned substrate and a lanthanum halide source material in a first boat and a dopant charge in a second boat;
   depositing a doped lanthanum halide polycrystalline non-columnar scintillator film on a surface of the positioned substrate by a process comprising applying heat to the evaporation chamber so as to vaporize scintillator source material for film deposition, wherein applying heat comprises maintaining a temperature relationship of $T_{wall} > T_{source} > T_{substrate}$ for at least a portion of the deposition process, and wherein the scintillator film comprises a different lattice structure from that of the substrate.

15. The method of claim 14, wherein the dopant charge comprises a Ce halide salt.

16. The method of claim 14, wherein the scintillator film comprises LaBr3:Ce, $LaBr_3$:Pr, $LaCl_3$:Ce, or $LaCl_3$:Pr.

17. The method of claim 14, wherein the scintillator film deposition is performed in a vacuum.

18. The method of claim 14, further comprising forming at least one of a coating of a reflective material or a protective material on a surface of the scintillator film.

19. The method of claim 18, wherein the protective material comprises a para-xylylene polymer composition.

20. The method of claim 18, wherein scintillator film deposition is performed in a vacuum and deposition of the reflective material or protective material is performed without breaking the vacuum.

21. A hot wall evaporation apparatus for depositing a doped lanthanum halide polycrystalline non-columnar scintillator film on a surface of a substrate, the apparatus comprising:
   an evaporation chamber having a first end with a substrate holder, a second end with a lanthanum halide charge boat and a dopant charge boat, and one or more chamber walls at least partially disposed between the first and second ends; and
   a heating system coupled to the evaporation chamber and configured to apply heating to the chamber so as to vaporize a scintillator source material positioned in the one or more boats for deposition of a doped lanthanum halide polycrystalline non-columnar scintillator film on a surface of a substrate positioned in the holder, the applied heating comprising a temperature relationship of $T_{wall} > T_{source} > T_{substrate}$ wherein the scintillator film comprises a different lattice structure from that of the substrate.

22. The apparatus of claim 21, wherein the apparatus is disposed within a vacuum chamber.

23. The apparatus of claim 21, wherein the dopant charge boat extends axially through at least a portion of the lanthanum halide charge boat.

24. The apparatus of claim 21, wherein the evaporation chamber comprises a quartz cylinder.

25. The apparatus of claim 21, further comprising a substrate-temperature control system coupled to the substrate holder and configured to heat or cool a substrate positioned in the holder.

* * * * *